(12) United States Patent
Park et al.

(10) Patent No.: US 7,170,494 B2
(45) Date of Patent: Jan. 30, 2007

(54) OPTICAL NAVIGATION SENSOR DEVICE AND IMAGE PROCESSING METHOD USING 2-DIMENSIONAL SEQUENTIAL IMAGE PROCESS

(75) Inventors: Keun-Woo Park, Kyunggi-do (KR); Won-Tae Choi, Kyunggi-do (KR); Kyoung-Joong Min, Kyunggi-do (KR); Byoung-Won Hwang, Suwon-si (KR); Kang-ju Kim, Suwon-si (KR)

(73) Assignee: Samsung Electro-Mechanics Co., Ltd (KR)

( * ) Notice: Subject to any disclaimer, the term of this patent is extended or adjusted under 35 U.S.C. 154(b) by 578 days.

(21) Appl. No.: 10/743,872

(22) Filed: Dec. 24, 2003

(65) Prior Publication Data
US 2005/0072905 A1    Apr. 7, 2005

(30) Foreign Application Priority Data
Oct. 2, 2003    (KR) .................... 10-2003-0068766

(51) Int. Cl.
*G09G 5/00* (2006.01)
(52) U.S. Cl. .................. 345/166; 345/156; 345/163
(58) Field of Classification Search ................ 345/156, 345/163, 165, 166
See application file for complete search history.

(56) References Cited

U.S. PATENT DOCUMENTS 6,697,052 B2 * 2/2004 Shen et al. ................. 345/166

6,927,758 B1 * 8/2005 Piot et al. ................... 345/166

FOREIGN PATENT DOCUMENTS

JP    2000-020230    1/2000

\* cited by examiner

*Primary Examiner*—Richard Hjerpe
*Assistant Examiner*—Duc Dinh
(74) *Attorney, Agent, or Firm*—Morgan, Lewis & Bockius, LLP

(57) ABSTRACT

An optical navigation sensor device and an image processing method using a 2-dimensional sequential image process are disclosed. A pre-processor stores digital voltage values of respective pixels of an image received from a pre-processor in a memory, performs a pre-process for the digital voltage values of respective pixels sequentially received from the memory, thereby producing a pre-processed current image, and extracts a pre-processed current central image from the pre-processed current image. A motion coordinate calculator stores the pre-processed current central image as X/Y-axis reference image candidates, determines replacement of X/Y-axis reference images for calculation of motion coordinate values of a next pre-processed image in accordance with X/Y-axis motions of the pre-processed current image, and compares the pre-processed current image with the X/Y-axis reference images, thereby calculating X/Y-axis motion coordinate values of the pre-processed current image.

12 Claims, 16 Drawing Sheets

General Mouse Pad

Particular Mouse Pad

Current Support Surface Image (4bit)

Pre-processed
Current Support Surface Image (1bit)

Current Support Surface Image (4bit)

Pre-processed
Current Support Surface Image (1bit)

Pre-processed Current Central Image

Pre-processed Current Image 16 x 16 Pixels 16 x 16 Pixels 16 x 16 Pixels

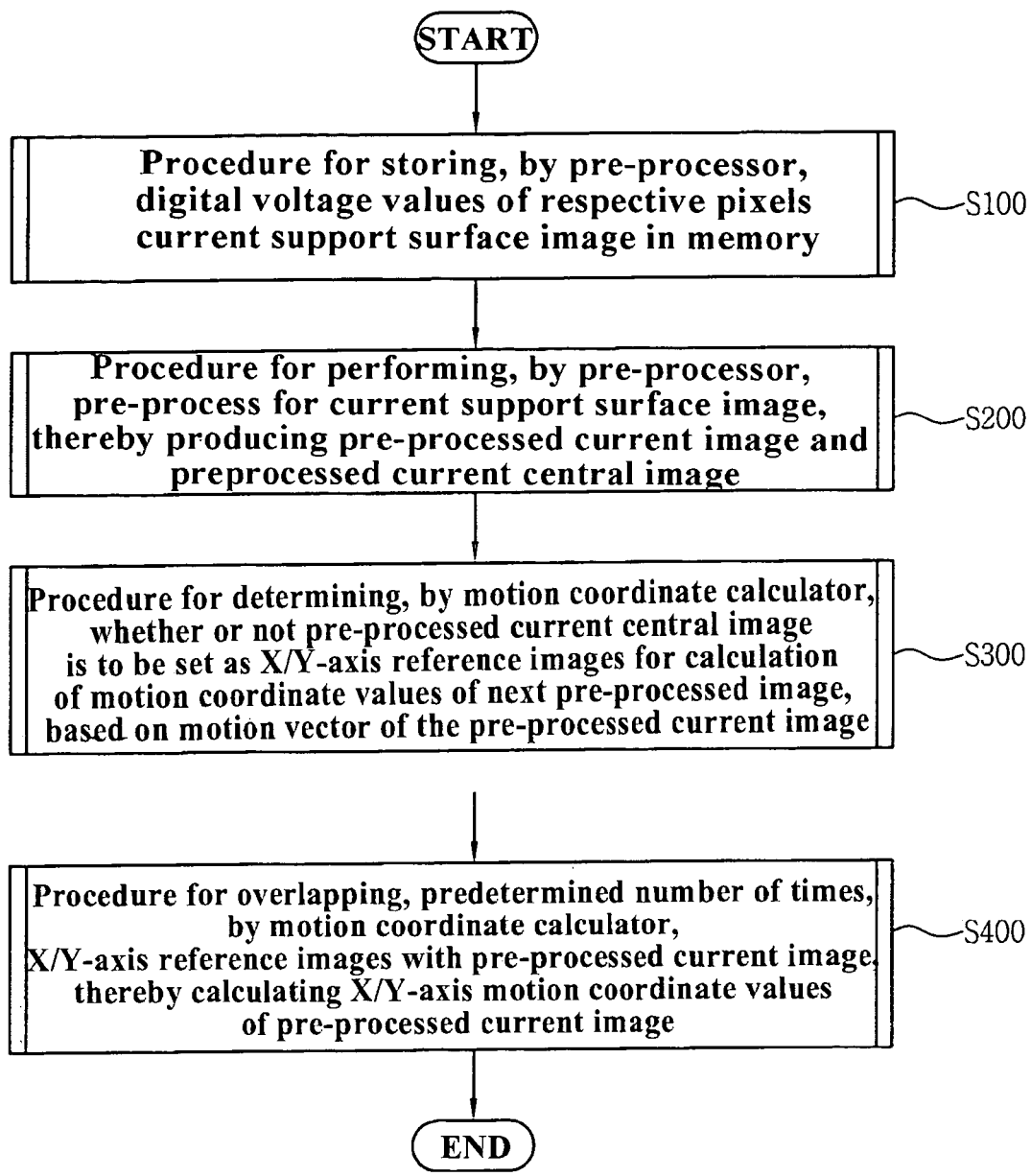

Fig. 9

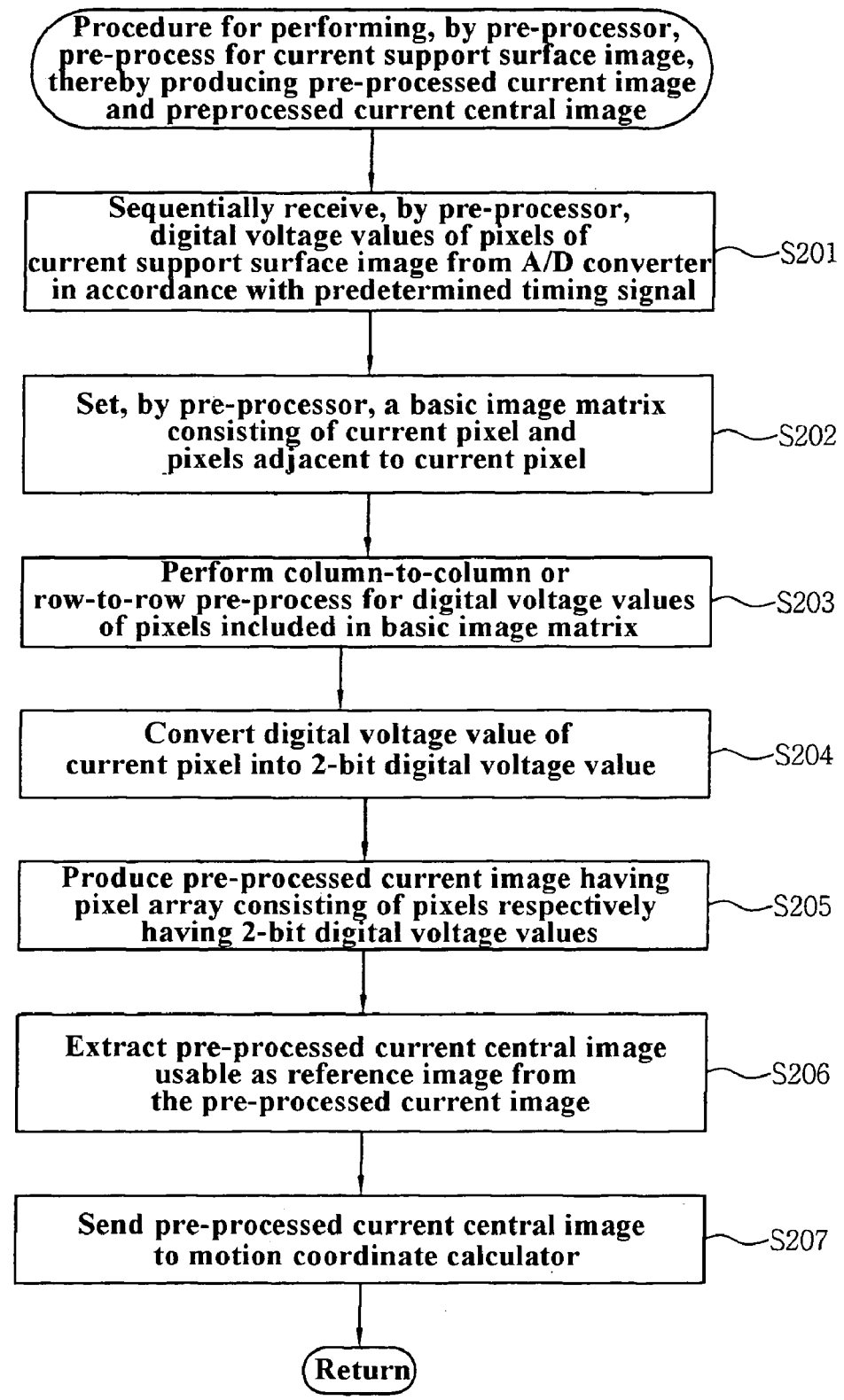

- Procedure for performing, by pre-processor, pre-process for current support surface image, thereby producing pre-processed current image and preprocessed current central image

- Sequentially receive, by pre-processor, digital voltage values of pixels of current support surface image from A/D converter in accordance with predetermined timing signal — S201

- Set, by pre-processor, a basic image matrix consisting of current pixel and pixels adjacent to current pixel — S202

- Perform column-to-column or row-to-row pre-process for digital voltage values of pixels included in basic image matrix — S203

- Convert digital voltage value of current pixel into 2-bit digital voltage value — S204

- Produce pre-processed current image having pixel array consisting of pixels respectively having 2-bit digital voltage values — S205

- Extract pre-processed current central image usable as reference image from the pre-processed current image — S206

- Send pre-processed current central image to motion coordinate calculator — S207

- Return

OPTICAL NAVIGATION SENSOR DEVICE AND IMAGE PROCESSING METHOD USING 2-DIMENSIONAL SEQUENTIAL IMAGE PROCESS

BACKGROUND OF THE INVENTION

1. Field of the Invention

The present invention relates to an optical navigation sensor device and an image processing method using a 2-dimensional sequential image process, and more particularly to an optical mouse capable of converting respective voltage values of pixels of an image produced therefrom into digital voltage values each having a certain bit value through a pre-process, in order to prevent the pixel values from being varied, thereby accurately tracing a motion thereof, and an image processing method using the optical mouse.

2. Description of the Related Art

An optical mouse is a peripheral device for a computer for indicating the position of a pointer on the screen of a display unit included in the computer. Under the condition in which such an optical mouse is laid on an optional support surface, such as a table surface, made of a certain material, it performs a signal processing operation for a light reflected from the support surface after being emitted from a light emitting diode installed in a body of the optical mouse in order to detect respective shifted amounts of the optical mouse in X and Y-axes, and moves a pointer on the screen of a display unit in X and Y-axis directions through the display unit.

Although such an optical mouse operates normally on a general mouse pad having a distinct pattern while exhibiting a low reflectance, as shown in FIG. 1a, it has a problem in that it operates unstably on a support surface, such as a gel (yellow) pad, exhibiting a severe scattering of light, as shown in FIG. 1b.

As a conventional optical mouse control method for solving such a problem, a method has been proposed which is adapted to convert light beams incident onto respective pixels after being reflected from a support surface, on which an optical mouse is laid, into digital voltages values of 4 to 8 bits, in order to measure the directionality of the optical mouse.

In the case of this optical mouse control method, however, there may be noise components in digital voltage values due to a micro variation in light amount of pixels and noise generated in an analog circuit used in the optical mouse control method. For this reason, the digital voltage value of each pixel may vary even when the optical mouse does not move. As a result, it is impossible to accurately and effectively measure the directionality of the optical mouse.

In order to solve this problem, another optical mouse control method has been proposed. In accordance with this method, a light beam incident onto each pixel after being reflected from a support surface is converted into a digital voltage value of 4 to 8 bits which is, in turn, compared with the digital voltage values of other pixels, so as to determine whether the pixel is light or dark (1 or 0), as shown in FIGS. 2a and 2b. Thus, each pixel is set to have a 1-bit value corresponding to the light or darkness thereof. Based on the 1-bit value, the directionality of the optical mouse is measured.

In this conventional mouse control method, however, the directionality of the optical mouse is emphasized in a particular direction in accordance with which peripheral pixels are compared with the current pixel in association with brightness. For this reason, although the optical mouse exhibits superior navigation characteristics in the particular direction, it exhibits inferior navigation characteristics in other directions.

SUMMARY OF THE INVENTION

The present invention has been made in view of the above mentioned problems, and an object of the invention is to provide an optical navigation sensor device capable of converting the digital voltage value of each pixel of an image produced therefrom into a bit value having a bi-directionality, thereby accurately tracing a motion thereof, and an image processing method using a 2-dimensional sequential image process carried out by use of the optical navigation sensor device.

In accordance with one aspect, the present invention provides an optical navigation sensor device comprising: an image pixel array for calculating analog voltage values of pixels thereof respectively corresponding to relative intensities of reflected light beams incident to the pixels from a support surface, on which the sensor device is laid; an A/D converter for converting the analog voltage values of the pixels received thereto into corresponding digital voltage values, respectively, thereby producing a current image of the support surface; a pre-processor for sequentially receiving the digital voltage values from the A/D converter for all pixels of the current support surface image in accordance with a predetermined timing signal, performing a pre-process for the current support surface image, thereby producing a pre-processed current image consisting of pixels each having a 2-bit digital voltage value, and extracting, from the pre-processed current image, a pre-processed current central image having a predetermined pixel array; and a motion coordinate calculator for setting, as X/Y-axis reference image candidates, the pre-processed current central image received from the pre-processor, calculating an X-axis motion vector while overlapping a previously-set X-axis reference image with the pre-processed current image, thereby calculating an X-axis motion coordinate value of the pre-processed current image, and calculating a Y-axis motion vector while overlapping a previously-set Y-axis reference image with the pre-processed current image, thereby calculating a Y-axis motion coordinate value of the pre-processed current image.

In accordance with another aspect, the present invention provides an image processing method using a 2-dimensional sequential image process, comprising the steps of: (A) storing, by a pre-processor, digital voltage values of respective pixels of an image received from a pre-processor via an analog/digital (A/D) converter in a memory; (B) performing, by the pre-processor, a pre-process for the digital voltage values of respective pixels sequentially received from the memory in accordance with a predetermined timing signal, thereby producing a pre-processed current image, and extracting a pre-processed current central image from the pre-processed current image; (C) determining, by a motion coordinate calculator, whether or not the pre-processed current central image is to be set as X/Y-axis reference images for calculation of motion coordinate values of a next pre-processed image, based on a motion vector of the pre-processed current image; and (D) comparing, by the motion coordinate calculator, the pre-processed current image received from the pre-processor with X/Y-axis reference images respectively stored in X/Y-channel reference units, thereby calculating X/Y-axis motion coordinate values of the pre-processed current image.

BRIEF DESCRIPTION OF THE DRAWINGS

The above objects, and other features and advantages of the present invention will become more apparent after reading the following detailed description when taken in conjunction with the drawings, in which:

FIG. 7 is a flow chart illustrating an image processing method using a 2-dimensional sequential image process according to the present invention;

FIG. 9 is a flow chart illustrating the procedure for performing, by the pre-processor, a pre-process for the current support surface image, thereby producing a pre-processed current image, and extracting a pre-processed current central image from the pre-processed current image in accordance with the present invention;

DESCRIPTION OF THE PREFERRED EMBODIMENTS

Now, an optical navigation sensor device and a method for processing images using a 2-dimensional sequential image process will be described in detail with reference to the annexed drawings.

First, the configuration and operation of the optical navigation sensor device according to the present invention will be described with reference to FIGS. 3 and 4.

Figure 3:
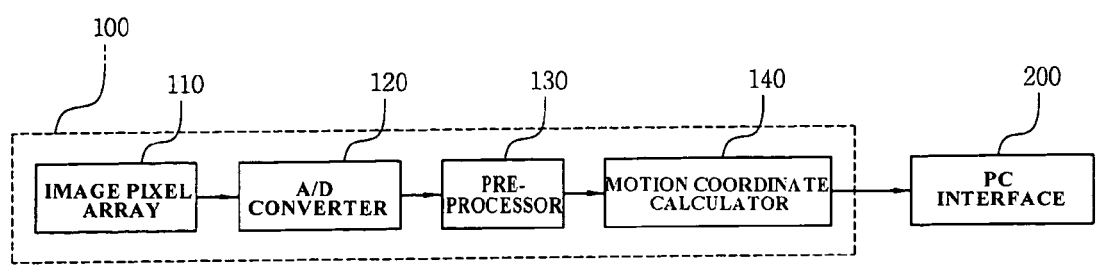
FIG. 3 is a block diagram illustrating the configuration of an optical navigation sensor device according to the present invention.
Figure 4:
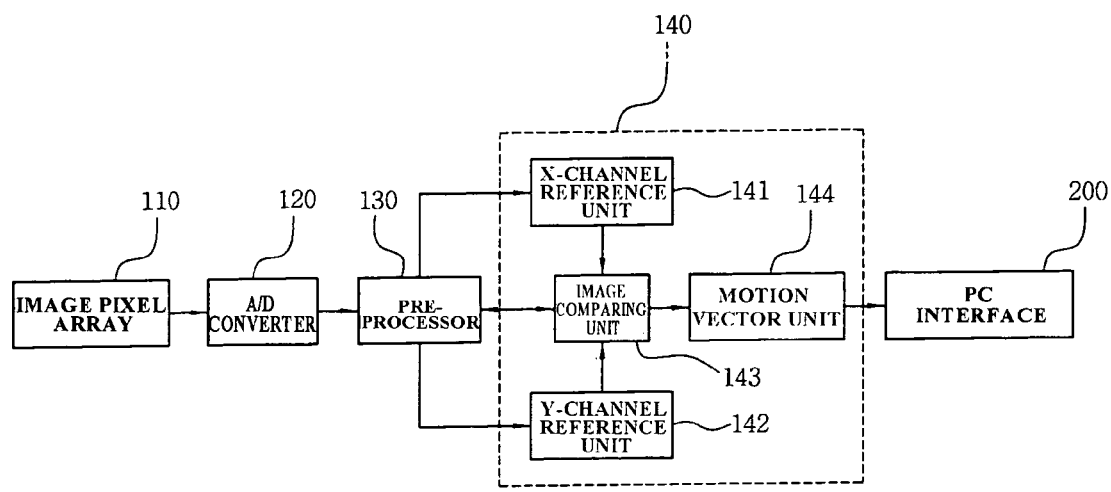
FIG. 4 is a block diagram illustrating the detailed configuration of a motion coordinate calculator included in the optical navigation sensor device according to the present invention.

FIG. 3 is a block diagram illustrating the configuration of the optical navigation sensor device according to the present invention. FIG. 4 is a block diagram illustrating the detailed configuration of a motion coordinate calculator according to the present invention.

The optical navigation sensor device according to the present invention, which may be an optical mouse 100, includes an image pixel array 110, an analog/digital (A/D) converter 120, a pre-processor 130, and a motion coordinate calculator 140. Hereinafter, these constitutive elements will be described in detail.

The image pixel array 110 receives light beams reflected from a support surface, on which the optical mouse is laid, after being emitted from a light emitting element installed in the optical mouse 100, converts optical energies respectively corresponding to relative intensities of the received reflected light beams into analog voltage values, and sends the analog voltage values to the A/D converter 120.

That is, the reflected light beams respectively incident to pixels forming the image pixel array 110 may have different optical energies due to the material, irregularity, or light/darkness difference of the support surface at regions corresponding to the pixels. Accordingly, different analog voltage values may be outputted from respective pixels.

Although the image pixel array has a pixel array structure of 18×18 pixels in the illustrated embodiment of the present invention, it is not limited to such a pixel array structure. In accordance with the present invention, diverse pixel array structures may be used.

The A/D converter 120 converts the analog voltage value, received from the image pixel array 110 for each pixel, into a digital voltage value of certain bits, for example, 4 to 8 bits, so as to produce a current image of the support surface. The A/D converter 120 outputs the produced current image to the pre-processor 130.

The pre-processor 130 sequentially receives the digital voltage values from the A/D converter 120 for all pixels, in accordance with a predetermined timing signal, and stores the received digital voltage value in a memory (not shown).

The memory does not simultaneously receive the digital voltage values of the 18×18 pixels, but sequentially receives the digital voltage values each having 4 to 8 bits through 4 to 8 lines in sync with predetermined timing signals, respectively. To this end, the memory has a line buffer structure including 3 to 18 memory structures each having a memory size of 4 to 8 bits.

When the memory receives a digital voltage value of 4 to 8 bits from the A/D converter 120, each of the digital voltage values previously received and stored in the memory is shifted one column to be stored at a next column in the line buffer structure. As a result, the digital voltage value previously stored in the last column of the line buffer structure is discarded.

The pre-processor 130 performs a pre-process for data about the current support surface image sequentially received from the memory, thereby producing a pre-processed current support surface image having a pixel array structure consisting of pixels each having a digital voltage value of 2 bits.

This pre-process will be described in more detail. When the pre-processor 130 receives a digital voltage value converted to have certain bits, for example, 4 to 8 bits, for one of the pixels forming the current support surface image, it performs a 2-bit conversion for the received digital voltage value. That is, the digital voltage values of the pixels vertically arranged adjacent to the current pixel corresponding to the digital voltage value currently inputted to the pre-processor 130 are added to the digital voltage value of the current pixel, thereby deriving a current X-axis value CURRENT_X. The digital voltage values of the pixels vertically arranged adjacent to the pixel horizontally spaced apart from the current pixel by a predetermined distance are also added to the horizontally spaced pixel, thereby deriving a previous X-axis value BEFORE_X. Also, the digital voltage values of the pixels horizontally arranged adjacent to the current pixel are added to the digital voltage value of the current pixel, thereby-deriving a current Y-axis value CURRENT_Y. The digital voltage values of the pixels horizontally arranged adjacent to the pixel vertically spaced apart from the current pixel by a predetermined distance are also added to the vertically spaced pixel, thereby deriving a previous Y-axis value BEFORE_Y. Where it is assumed that the current support surface image has a pixel array shown in the following Table 1, and the current pixel to be currently subjected to a 2-bit conversion for its digital voltage value is a pixel ADC22, the values CURRENT_X, BEFORE_X, CURRENT_Y, and BEFORE_Y can be derived using the following Expressions 1 and 2:

TABLE 1

| ADC00 | ADC01 | ADC02 | ADC03 | ADC04 | ADC05 |
|---|---|---|---|---|---|
| ADC10 | ADC11 | ADC12 | ADC13 | ADC14 | ADC15 |
| ADC20 | ADC21 | ADC22 | ADC23 | ADC24 | ADC25 |

Expression 1

CURRENT_X = ADC02 +ADC12 +ADC22,
BEFORE_X = ADC00 +ADC10 +ADC22

Expression 2

CURRENT_Y = ADC20 +ADC21 +ADC22,
BEFORE_Y = ADC00 +ADC01 +ADC02

After deriving the values CURRENT_X and BEFORE_X using Expression 1, the value CURRENT_X is compared with the value BEFORE_X in order to determine whether or not the value CURRENT_X is larger than the value BEFORE_X. The result of the comparison is converted into a value of 1 bit which is, in turn, stored as a value COMP_X. Also, after deriving the values CURRENT_Y and BEFORE_Y using Expression 2, the value CURRENT_Y is compared with the value BEFORE_Y in order to determine whether or not the value CURRENT_Y is larger than the value BEFORE_Y. The result of the comparison is converted into a value of 1 bit which is, in turn, stored as a value COMP_Y. Thus, the digital voltage value of the current pixel is converted into a value of 2 bits respectively corresponding to the values COMP_X and COMP_Y.

Upon converting the digital voltage value of the current pixel, received from the memory, into a value of certain bits, the pre-processor 130 may apply a certain weight to certain pixels arranged adjacent to the current pixel.

When it is determined in the comparison of the current and previous values that the current value is larger than the previous value, the value of the comparison result is set to "1". On the other hand, when the current value is smaller than the previous value, the value of the comparison result is set to "0". Where it is assumed that the converted value of 2 bits is represented by "Image_2 bit", this "Image_2 bit" may have diverse values in accordance with different values of vectors, that is, COMP_X and COMP_Y, respectively, as described in the following Table 2.

TABLE 2

| COMP_X | COMP_Y | Image_2bit | Condition |
|---|---|---|---|
| 0 | 0 | 0 | CURRENT_X < BEFORE_X |
|   |   |   | CURRENT_Y < BEFORE_Y |
| 0 | 1 | 1 | CURRENT_X < BEFORE_X |
|   |   |   | CURRENT_Y > BEFORE_Y |

TABLE 2-continued

| COMP_X | COMP_Y | Image_2bit | Condition |
|---|---|---|---|
| 1 | 0 | 2 | CURRENT_X > BEFORE_X |
|   |   |   | CURRENT_Y < BEFORE_Y |
| 1 | 1 | 3 | CURRENT_X > BEFORE_X |
|   |   |   | CURRENT_Y > BEFORE_Y |

Based on the conditions described in Table 2, the pre-processor 130 stores, in each pixel, an Image_2 bit value derived by performing a 2-bit conversion for the 4-bit digital voltage value of the pixel received from the memory, as described in the following Table 3.

TABLE 3

| x | x | x | x | x | x |
|---|---|---|---|---|---|
| x | x | x | x | x | x |
| x | x | 0, 1, 2 or 3 | 0, 1, 2 or 3 | 0, 1, 2 or 3 | 0, 1, 2 or 3 |

In Table 3, the pixels designated by "x" are "don't care" pixels which may be ignored because it is impossible to calculate current and previous values associated therewith.

Thereafter, the pre-processor 130 extracts a central image having a certain pixel array from the pre-processed current support image produced in the above described manner, and sends the extracted central image to the motion coordinate calculator 140.

That is, the pre-processor 130 produces a pre-processed current image having pixel values of certain bits, that is, 2-bit digital voltage values, and then extracts a central image having a certain pixel array from the pre-processed current image.

This process will be described in more detail. Where the current support surface image has an 18×18 pixel array consisting of 18×18 pixels each having a value of 4 bits, a pre-processed current support surface image having a 16×16 pixel array consisting of 16×16 pixels each having a value of 2 bits is produced in accordance with a pre-process performed for the current support surface image using the above described Expressions 1 and 2.

That is, if the current support surface image has an n×n pixel array, the pre-processed current support surface image then has an (n−2)×(n−2) pixel array.

After the production of the pre-processed current support surface image having a certain pixel array, based on the current support surface image, the pre-processor 130 extracts a central image having a certain pixel array, for example, a 10×10 pixel array, from a certain portion, that is, a central portion, of the pre-processed current support surface image. The pre-processor 130 then sends the extracted central image to the motion coordinate calculator 140.

The motion coordinate calculator 140 sets the pre-processed current central support surface image received from the pre-processor 130 as X and Y-axis reference images in X and Y-channel reference units 141 and 142, in accordance with X and Y-axis motion vector values of the pre-processed current support surface image, respectively. The X and Y-channel reference unit 141 and 142 will be described hereinafter.

This process will be described in detail. Where the X-axis motion vector $V_X$ of the pre-processed current support surface image has a value of "0", the motion coordinate calculator 140 does not change an X-axis reference image previously set in the X-channel reference unit 141.

However, where the X-axis motion vector $V_X$ of the pre-processed current image has a value other than "0", the motion coordinate calculator 140 replaces the X-axis reference image previously set in the X-channel reference unit 141 with the pre-processed current central image currently received from the pre-processor 130.

Similarly, where the Y-axis motion vector $V_Y$ of the pre-processed current image has a value of "0", the motion coordinate calculator 140 does not change a Y-axis reference image previously set in the Y-channel reference unit 142.

However, where the Y-axis motion vector $V_Y$ of the pre-processed current image has a value other than "0", the motion coordinate calculator 140 replaces the Y-axis reference image previously set in the Y-channel reference unit 142 with the pre-processed current central image currently received from the pre-processor 130.

Figure 5A:
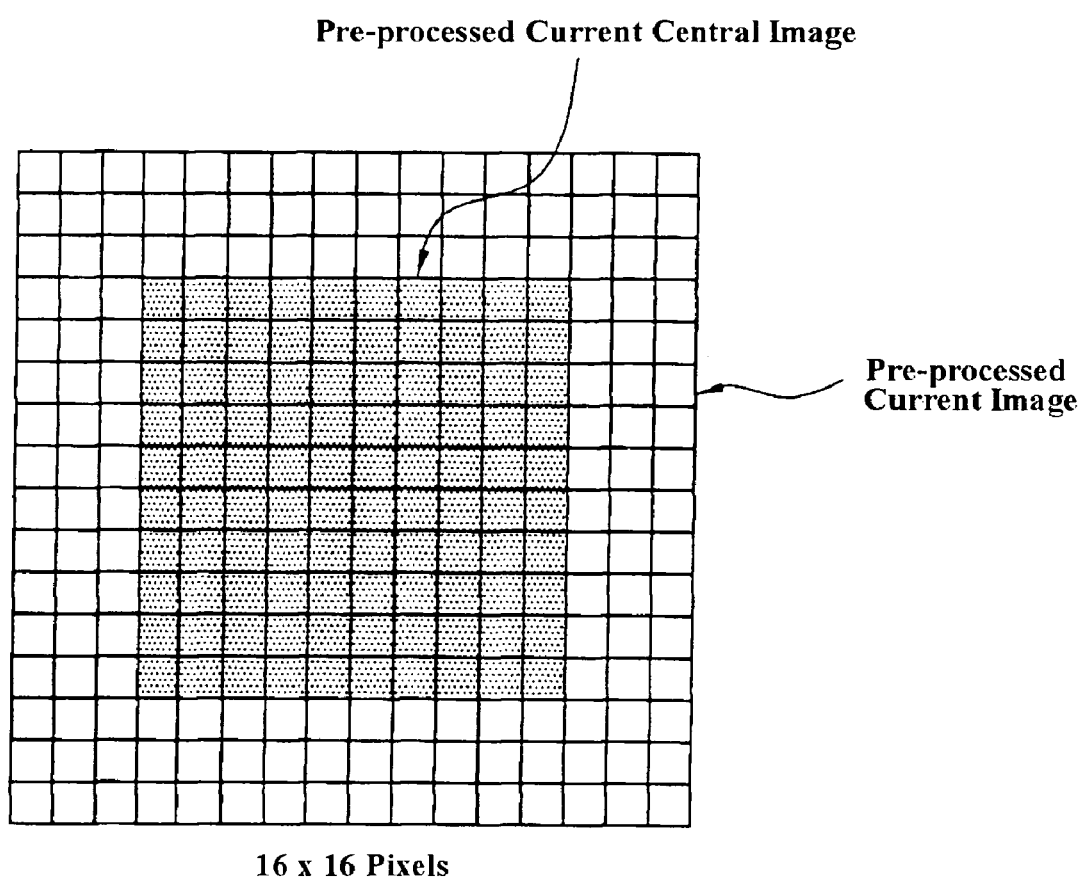
FIGS. 5a to 5c are schematic views illustrating the moved and still state of a pre-processed current image according to the present invention.

That is, where motion coordinates representing no motion of the pre-processed current image, as shown in FIG. 5a, are calculated, the pre-processed current central image is not set as a reference image, but stored as a reference image candidate. In this case, the previously-set reference image will be used upon calculating the motion coordinates of a next pre-processed image.

Figure 5B:
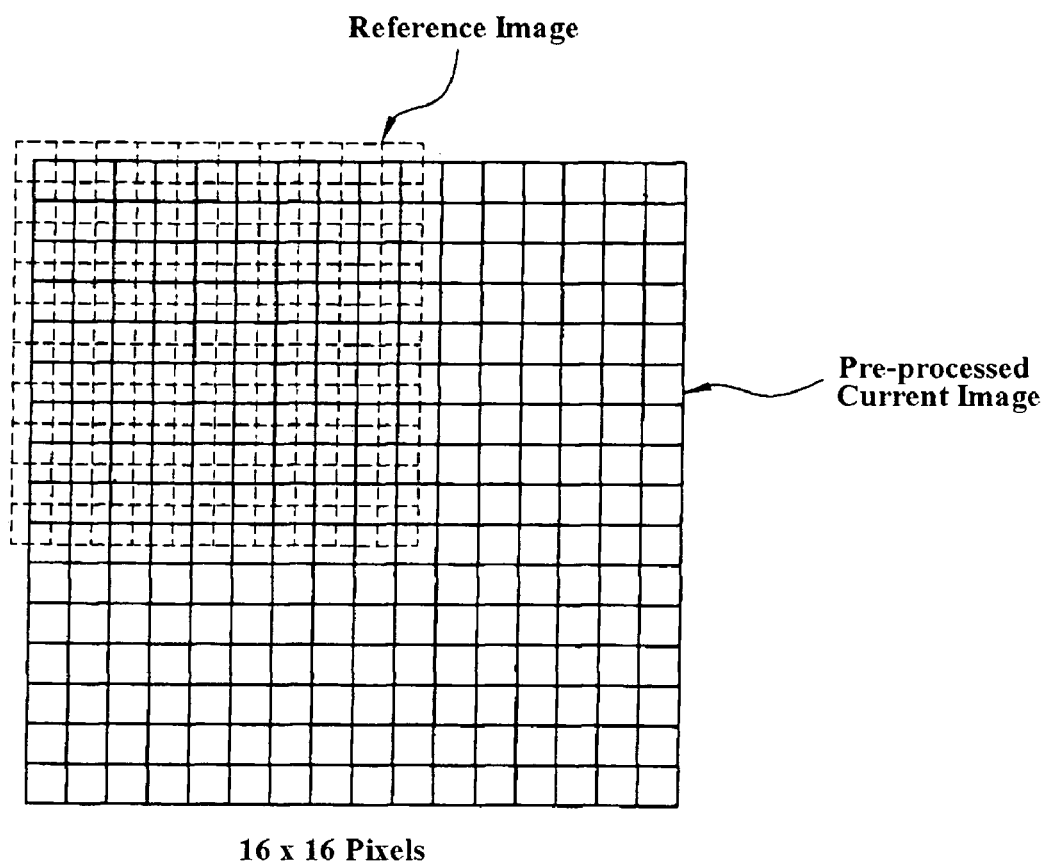
Figure 5C:
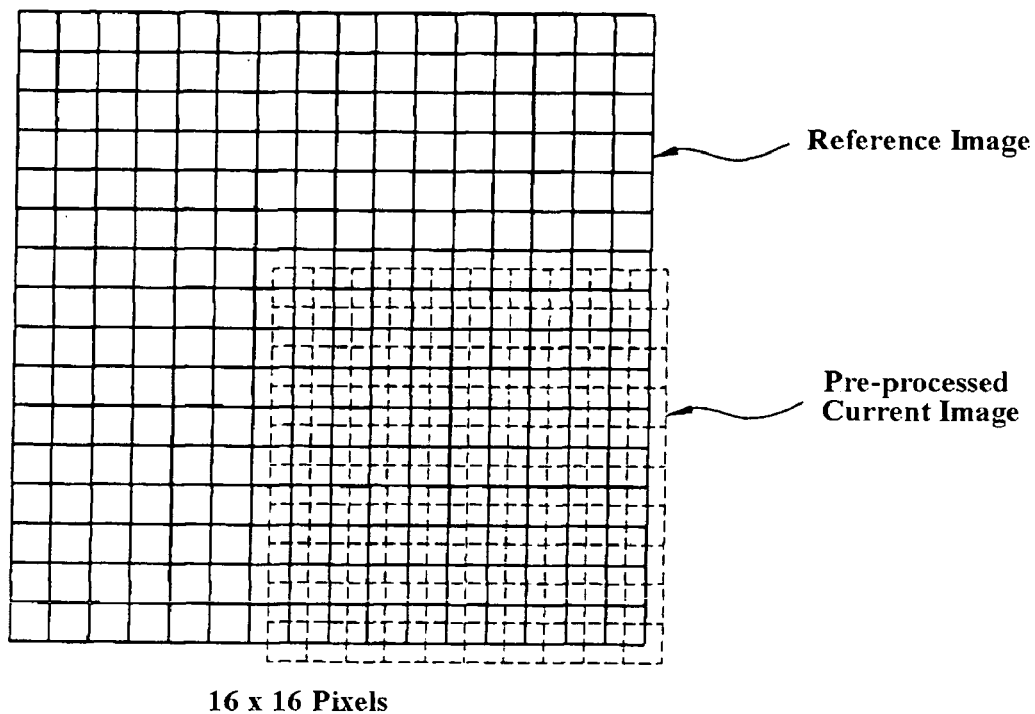

However, where motion coordinates representing motion of the pre-processed current image, as shown in FIG. 5b or 5c, are calculated, the pre-processed current central image stored as the reference image candidate is set as a reference image, for the calculation of the motion coordinates of a next pre-processed image.

Where it is assumed that the optical mouse moves in a rectilinear direction meeting the condition of "Y=3X" at a certain-speed, motion coordinates of (1,3), (1,3), (1,3), . . . are sequentially calculated. However, where the motion of the optical mouse is carried out at a lower or higher speed, motion coordinates different from those of the above case are calculated for every frame. Accordingly, the following problem may occur when the optical mouse moves at a low speed, unless reference images are set for X and Y channels, respectively.

This will be described in more detail. When the optical mouse moves at a low speed of, for example, 0.3 in an X-axis direction and 1 in a Y-axis direction per every frame, motion coordinates of (0,1), (0,1), (0,1), . . . are sequentially calculated because the motion of the optical mouse shorter than the distance corresponding to one pixel is not reflected. For this reason, it is impossible to calculate correct motion coordinates of the optical mouse.

Where reference images are set for X and Y channels, respectively, such a problem does not occur. For example, when the optical mouse performs a motion corresponding to 0.3 in an X-axis direction and 1 in a Y-axis direction, motion coordinates of the optical mouse correspond to (0,1). In this case, the pre-processed current central image is set only as a Y-axis reference image to be used for the calculation of motion coordinates of a next pre-processed image, without being set as an X-axis reference image to be used for the calculation of motion coordinates of the next pre-processed image. As the X-axis reference image to be used for the calculation of motion coordinates of the next pre-processed image, the previously-set X-axis reference image is still used.

Where the motion of the optical mouse corresponding to 0.3 in an X-axis direction and 1 in a Y-axis direction is continuously carried out for several successive frames, motion coordinates of (0,1), (0,1), (1,1), . . . are sequentially calculated. Accordingly, the Y-axis reference image is updated when every pre-processed current image is inputted, whereas the X-axis reference image is updated when every third pre-processed current image is inputted.

Therefore, it is possible to effectively detect a 2-dimensional motion by calculating an X-axis motion coordinate value in accordance with a comparison of the pre-processed current image with the X-axis reference image, and calculating a Y-axis motion coordinate value in accordance with a comparison of the pre-processed current image with the Y-axis reference image.

Figure 1A:
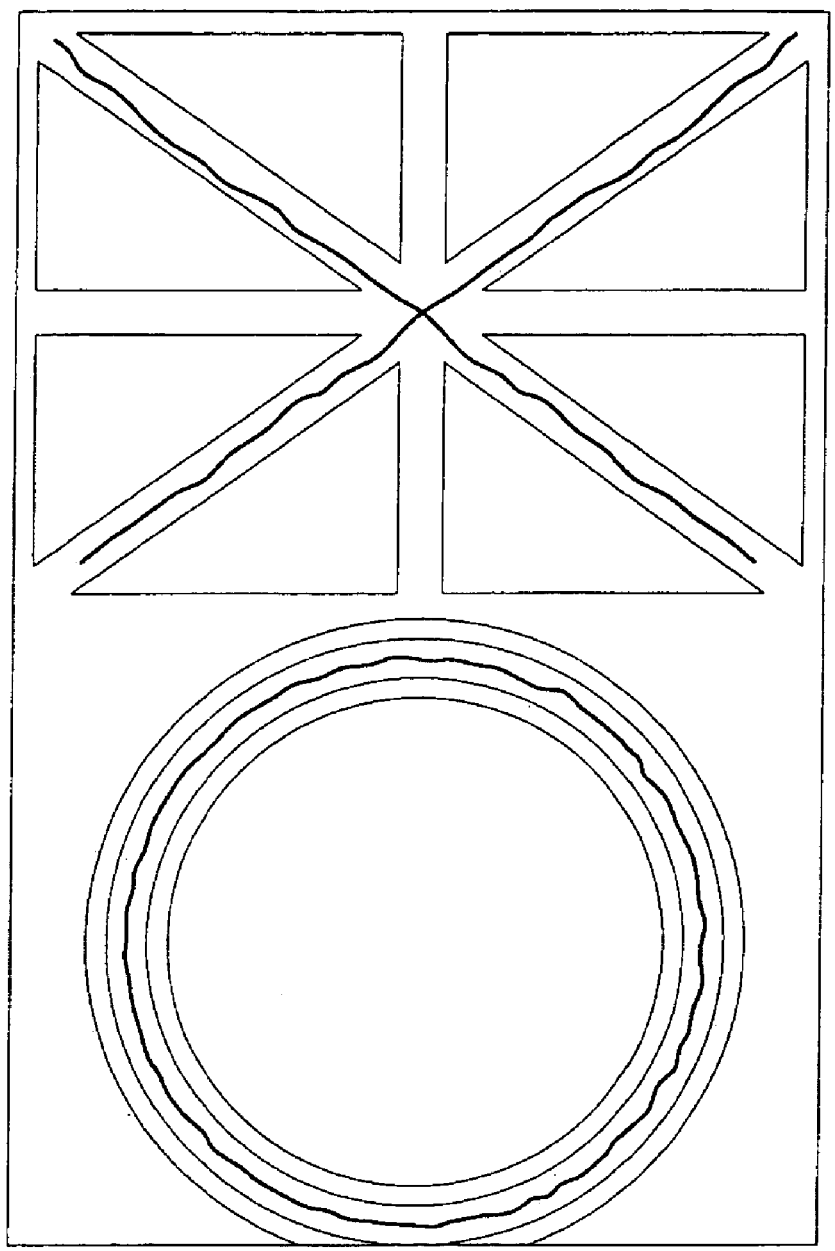
FIGS. 1a and 1b are schematic views illustrating pointer traces of an optical mouse produced when different mouse pads are used, respectively.
Figure 1B:
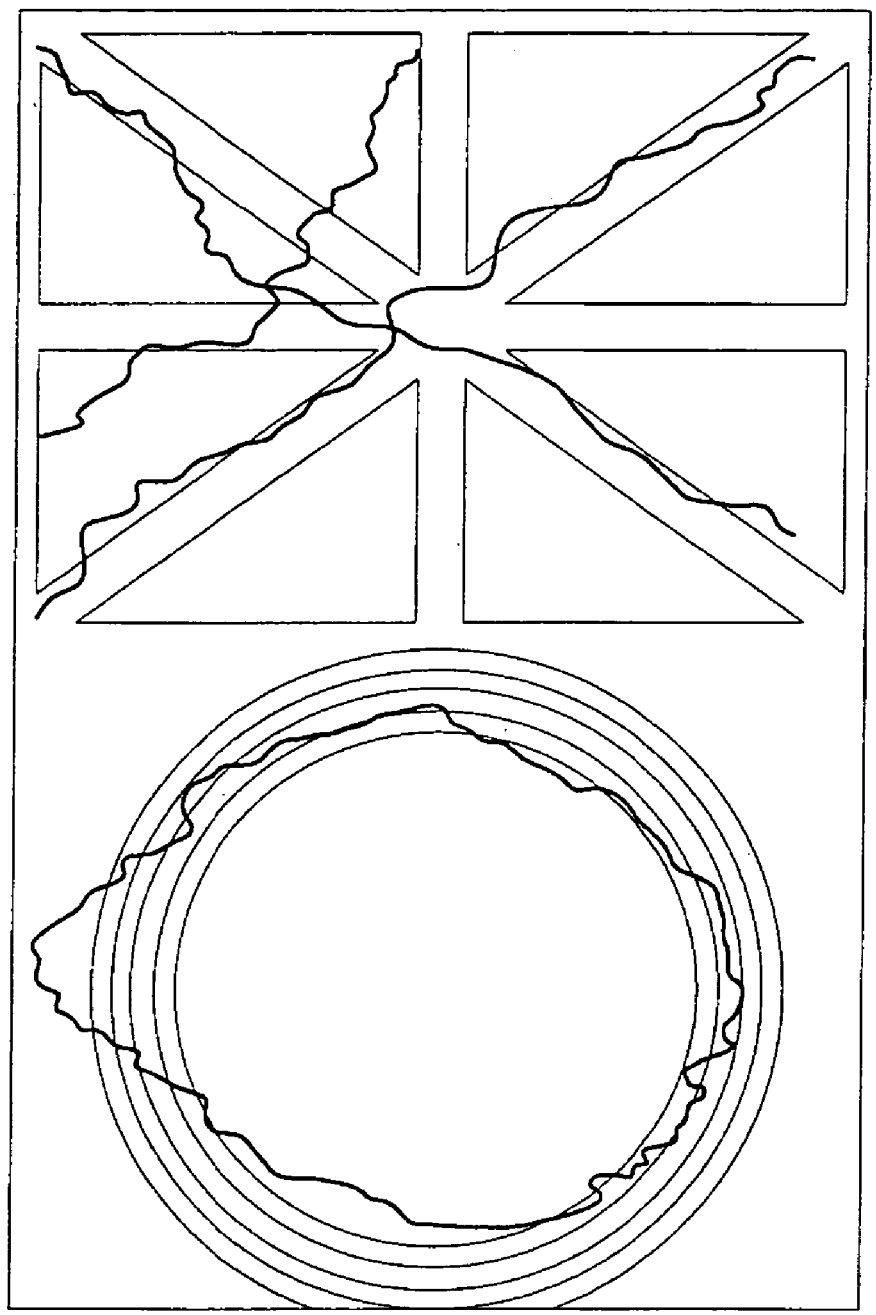
Figure 2A:
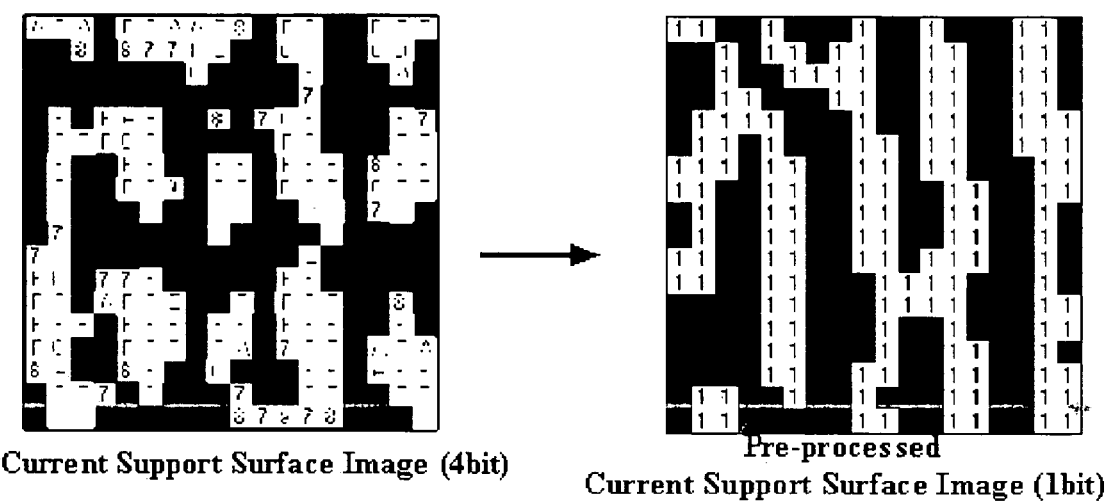
FIGS. 2a and 2b are schematic views illustrating images of a support surface, on which a conventional optical mouse having a uni-directionality is laid, the images being produced in accordance with a pre-process carried out by the conventional optical mouse.
Figure 2B:
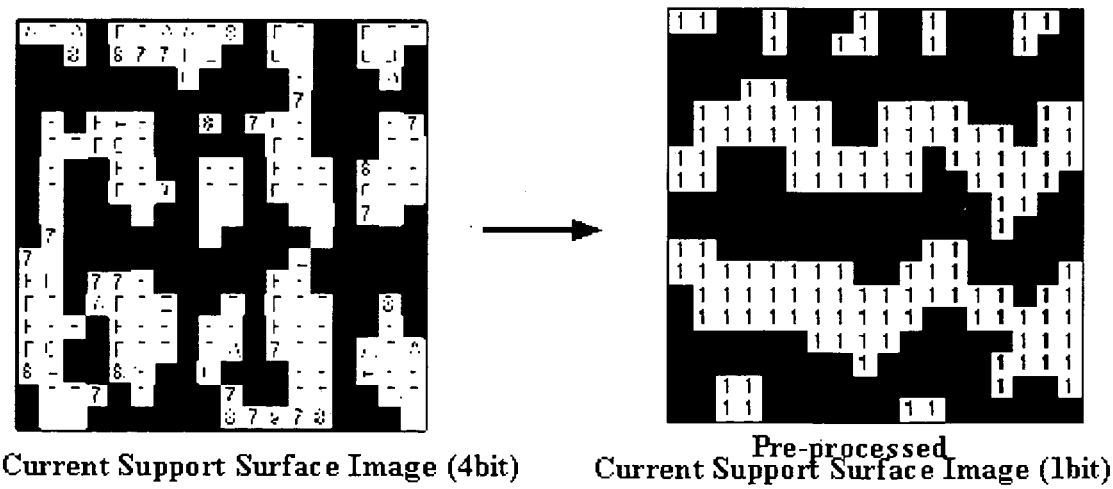

The motion coordinate calculator 140 calculates X and Y-axis motion coordinate values for the pre-processed current image, and sends the calculated motion coordinate values to a personal computer (PC) via a PC interface 200. As shown in FIG. 2, the motion coordinate calculator 140 includes an X-channel reference unit 141, a Y-channel reference unit 142, an image comparing unit 143, and a motion vector unit 144.

The X-channel reference unit 141 stores the pre-processed current central image as an X-axis reference image candidate, and determines, in accordance with an X-axis motion of the pre-processed current image, whether the previously-set X-axis reference image is to be replaced with the stored X-axis reference image candidate as an X-axis reference image for a next pre-processed image or to be maintained as the X-axis reference image for the next pre-processed image.

The Y-channel reference unit 142 stores the pre-processed current central image as a Y-axis reference image candidate, and determines, in accordance with a Y-axis motion of the pre-processed current image, whether the previously-set Y-axis reference image is to be replaced with the stored Y-axis reference image candidate as a Y-axis reference image for a next pre-processed image or to be maintained as the Y-axis reference image for the next pre-processed image.

The image comparing unit 143 receives the pre-processed current image from the pre-processor 130 in sync with a predetermined timing signal. Subsequently, the image comparing unit 143 compares the received pre-processed current image with the X-axis reference image while overlapping, a predetermined number of times, the X-axis reference image with the pre-processed current image in different overlap states, respectively. The image comparing unit 143 calculates the number of pixels present in the pre-processed current image while having the same bit values as those of the pixels included in the X-axis reference image, every time the X-axis reference image is overlapped with the pre-processed current image, and then sends the calculated value to the motion vector unit 144.

Also, the image comparing unit 143 compares the pre-processed current image received from the pre-processor 130 with the Y-axis reference image while overlapping, a predetermined number of times, the Y-axis reference image with the pre-processed current image in different overlap states, respectively. The image comparing unit 143 calculates the number of pixels present in the pre-processed current image while having the same bit values as those of the pixels included in the Y-axis reference image, every time the Y-axis reference image is overlapped with the pre-processed current image, and then sends the calculated value to the motion vector unit 144.

These operations will now be described in more detail with reference to FIGS. 6a and 6b.

Figure 6A:
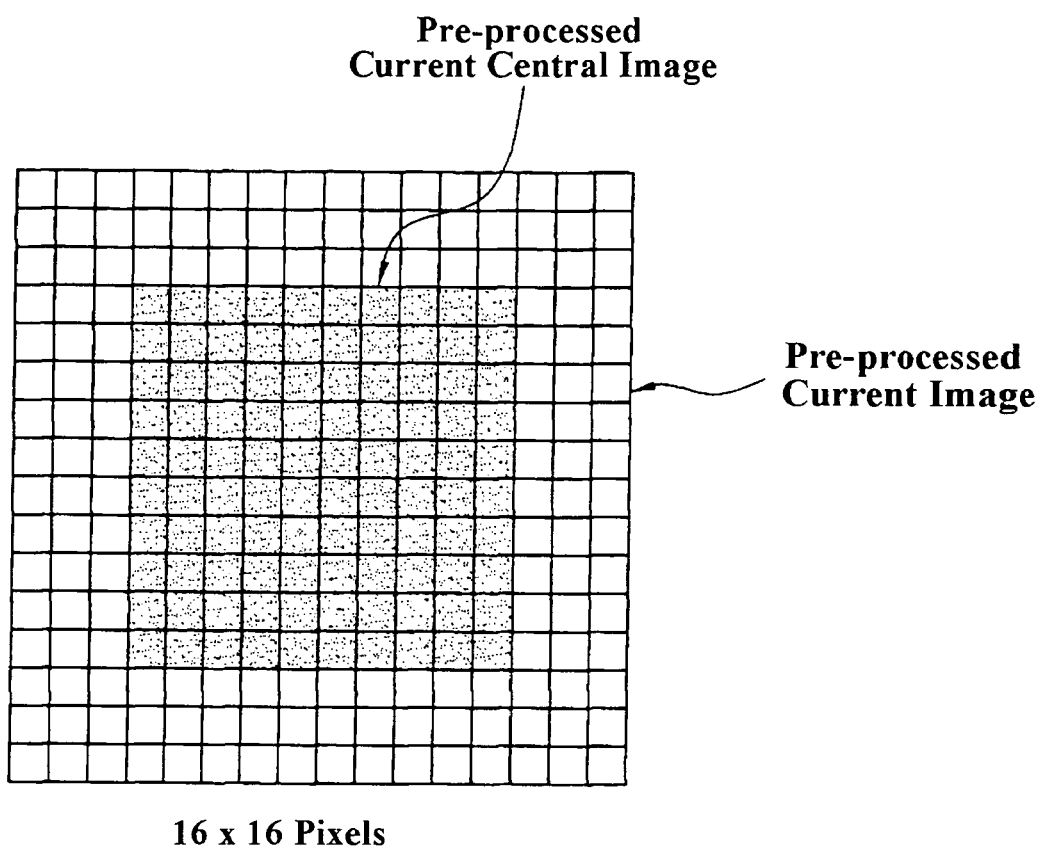
FIGS. 6a and 6b are schematic views illustrating the procedure of overlapping a reference image with the pre-processed current image in accordance with the present invention.

FIG. 6a is a schematic view illustrating the pre-processed current image inputted from the pre-processor 130 to the image comparing unit 143 along with the pixel array of the pre-processed current central image. FIG. 6b is a schematic view illustrating the procedure of overlapping, a predetermined number of times, a reference image with the pre-processed current image.

In the illustrated case, the motion coordinates of the pre-processed current image may have an X-axis coordinate value ranging from −3 to +3 and a Y-axis coordinate value ranging from −3 to +3. Accordingly, 49 motion coordinates may be present for the pre-processed current image.

Figure 6B:
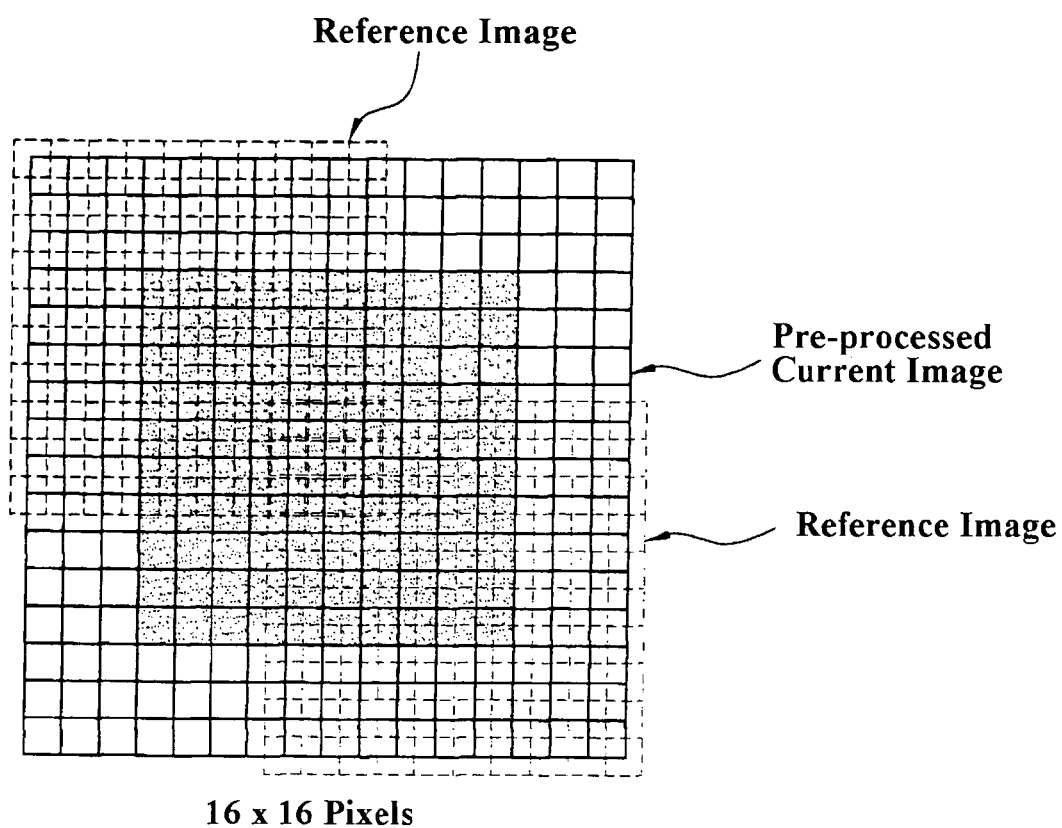

That is, the reference image, which has a 10×10 pixel array, as indicated by a phantom line in FIG. 6b, is overlapped a predetermined number of times, that is, 49 times, with the pre-processed current image while being sequentially shifted. In each of the 49 overlap states, the image comparing unit 143 calculates the number of pixels present in the pre-processed current image while having the same 2-bit values as those of the pixels included in the reference image. In all the 49 overlap states, there is no or little probability that the pre-processed current image completely has pixels having the same 2-bit values as those of all pixels in the reference image. Accordingly, the image comparing unit 143 sets, as a reference for calculation of a motion vector for the pre-processed current image, the overlap state in which the number of pixels present in the pre-processed current image while having the same bit values as those of the pixels included in the reference image is maximal, as compared to the remaining ones of the 49 overlap states.

The motion vector unit 144 sets, as an X-axis motion vector $V_X$, the X-axis coordinate value of the X-axis reference image in the case in which the number of pixels present in the pre-processed current image while having the same bit values as those of the pixels included in the X-axis reference image is maximal.

Thereafter, the motion vector unit 144 calculates an X-axis motion coordinate value of the pre-processed current image, based on the set X-axis motion vector $V_X$, and sends the calculated X-axis motion coordinate value to the PC via the PC interface 200.

The motion vector unit 144 also sets, as a Y-axis motion vector $V_Y$, the Y-axis coordinate value of the Y-axis reference image in the case in which the number of pixels present in the pre-processed current image while having the same bit values as those of the pixels included in the Y-axis reference image is maximal.

Thereafter, the motion vector unit 144 calculates a Y-axis motion coordinate value of the pre-processed current image, based on the set Y-axis motion vector $V_Y$, and sends the calculated Y-axis motion coordinate value to the PC via the PC interface 200.

These operations will be described in more detail. Where the reference image is overlapped a predetermined number of times, that is, 49 times, with the pre-processed current image while being sequentially shifted, 49 coordinates each having X and Y-axis coordinate values are produced which may be (−3,+3), (−2,+3), (−1,+3), (0,+3), (+1,+3), . . . (−1,−3), (0,−3), (+1,−3), (+2,−3), (+3,−3).

A selected one of these 49 X-axis coordinate values is set as an X-axis motion vector $V_X$. That is, the motion vector unit 144 sets, as the X-axis motion vector $V_X$, the X-axis coordinate value of the X-axis reference image in the case in which the number of pixels present in the pre-processed current image while having the same 2-bit values as those of the pixels included in the X-axis reference image is maximal.

Also, a selected one of the 49 Y-axis coordinate values is set as a Y-axis motion vector $V_Y$. That is, the motion vector unit 144 sets, as the Y-axis motion vector $V_Y$, the Y-axis coordinate value of the Y-axis reference image in the case in which the number of pixels present in the pre-processed current image while having the same 2-bit values as those of the pixels included in the Y-axis reference image is maximal.

Where the X-axis motion vector $V_X$ has a value of zero, the reference image previously set in the X-channel reference unit 141 is maintained as an X-axis reference image. However, where the X-axis motion vector $V_X$ has a value other than zero, an image corresponding to a predetermined portion of the pre-processed current image, for example, a central image corresponding to a central portion of the pre-processed current image, as shown in FIG. 6a, is set as an X-axis reference image for a next pre-processed image.

Similarly, where the Y-axis motion vector $V_Y$ has a value of zero, the reference image previously set in the Y-channel reference unit 142 is maintained as a Y-axis reference image. However, where the Y-axis motion vector $V_Y$ has a value other than zero, an image corresponding to a predetermined portion of the pre-processed current image, for example, a central image corresponding to a central portion of the pre-processed current image, as shown in FIG. 6a, is set as a Y-axis reference image for a next pre-processed image.

Now, an image processing method in the above described optical navigation sensor device using a 2-dimensional sequential image process in accordance with the present invention will be described with reference to FIGS. 7 to 11.

In accordance with this image processing method, as shown in FIG. 7, the pre-processor 130 first stores digital voltage values received from the A/D converter 120 for respective pixels of a current support surface image (S100).

Figure 8:
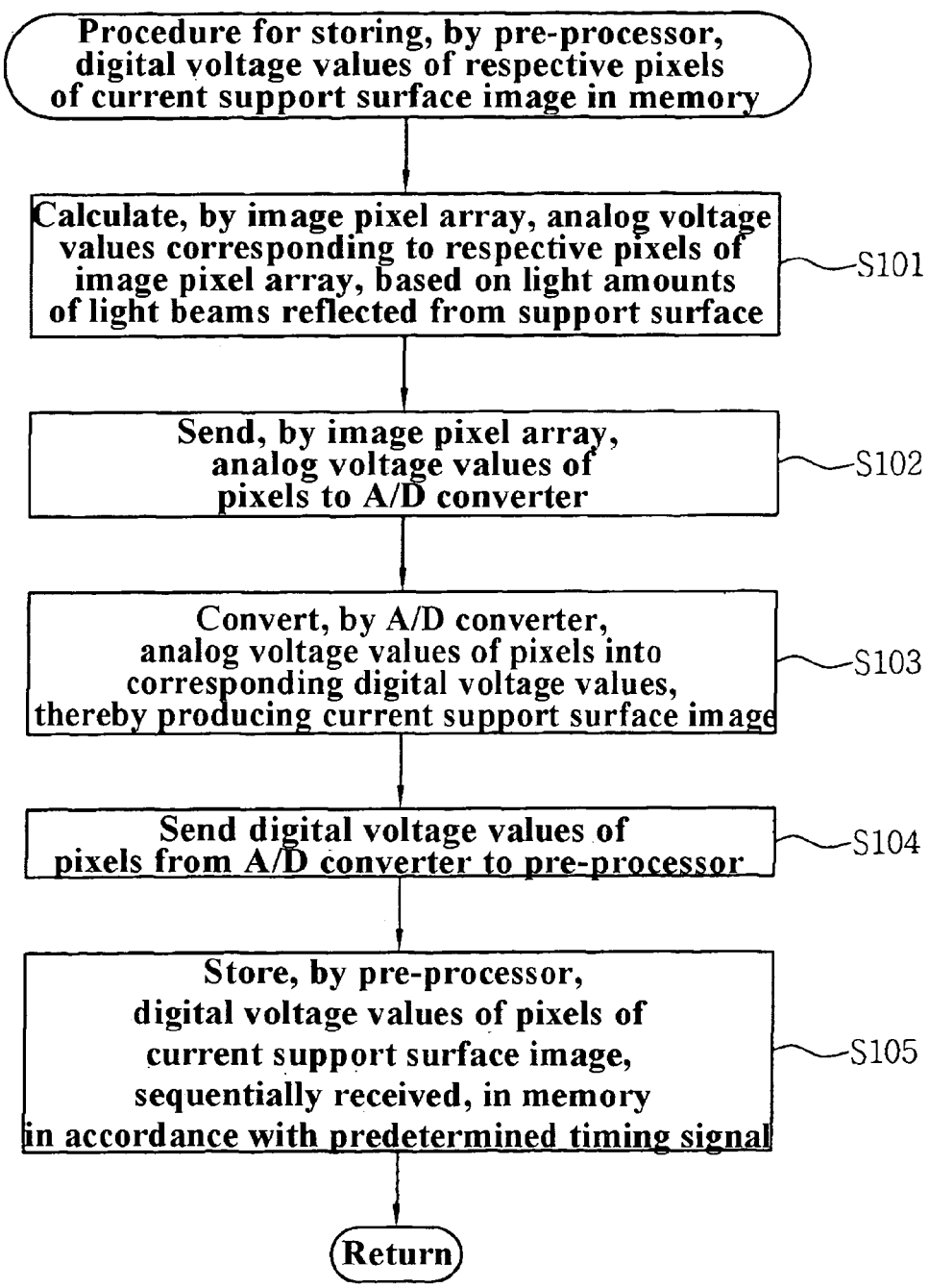
FIG. 8 is a flow chart illustrating the procedure for storing, by a pre-processor, digital voltage values of respective pixels of a current support surface image received from an image pixel array in a memory in accordance with the present invention.

This procedure will be described in detail with reference to FIG. 8. The image pixel array 110 performs an optoelectric conversion for light beams incident thereto after being reflected from a support surface, on which the optical mouse is laid, thereby converting optical energies of the incident light beams into analog voltage values, respectively (S101), and then sends the analog voltage values to the A/D converter 120 (S102).

The A/D converter 120 converts the analog voltage value, received from the image pixel array 110 for each pixel, into a digital voltage value of certain bits, for example, 4 to 8 bits, thereby producing a current image of the support surface (S103). The A/D converter 120 then sends the produced current image to the pre-processor 130 (S104).

The pre-processor 130 sequentially receives the digital voltage values from the A/D converter 120 for all pixels, in sync with a predetermined timing signal, and stores the received digital voltage value in its memory (S105).

Thus, the pre-processor 130 sequentially receives the digital voltage values from the A/D converter 120 for the pixels of the current support surface image, and produces a pre-processed current image having a certain pixel array from the current support surface image. Thereafter, the pre-processor 130 extracts, from the pre-processed current image, a pre-processed current central image usable as a reference image (S200).

This procedure will be described in detail with reference to FIG. 9. When the pre-processor 130 sequentially receives the digital voltage values from the A/D converter 120 for the pixels of the current support surface image, in sync with the predetermined timing signal (S201), it sets a basic image matrix consisting of a current pixel of the current support surface image to be currently converted into a certain bit value, and pixels adjacent to the current pixel (S202).

Although the basic image matrix has a 3×3 matrix structure, it is not limited to such a matrix structure. In accordance with the present invention, diverse matrix structures may be used.

Thereafter, the pre-processor 130 performs a column-to-column/row-to-row pre-process for the digital voltage values of the pixels included in the basic image matrix, using the above described Expressions 1 and 2 (S203), thereby converting the digital voltage value of the current pixel into a 2-bit digital voltage value (S204).

After completing conversion of respective digital voltage values of all pixels into corresponding 2-bit digital voltage values, the pre-processor 130 produces a pre-processed current image having a pixel array consisting of pixels respectively having the converted 2-bit digital voltage values (S205).

Here, if the current image has an n×n pixel array, prior to the conversion of the digital voltage value of each pixel thereof into a 2-bit value, the pre-processed current image then-has an (n−2)×(n−2) pixel array.

Thereafter, the pre-processor 130 extracts an image corresponding to a predetermined portion of the pre-processed current image, that is, a central image corresponding to a central portion of the pre-processed current image, so as to use the extracted central image as a reference image (S206). The pre-processor 130 then sends the extracted pre-processed current central image to the motion coordinate calculator 140 (S207)

When the motion coordinate calculator 140 receives, from the pre-processor 130, the pre-processed current central image having a certain pixel array usable as a reference image, it determines whether or not the pre-processed current central image is to be used as X and Y-axis reference images for the calculation of the motion coordinates of a next pre-processed image, in accordance with X and Y-axis motion vector values of the pre-processed current image, respectively (S300).

This procedure will be described in detail with reference to FIGS. 10a and 10b.

First, the procedure for setting the pre-processed current central image as an X-axis reference image for a next pre-processed image or maintaining the previously-set X-axis reference image, in accordance with the X-axis motion vector value of the pre-processed current image, will be described with reference to FIG. 10a.

Figure 10A:
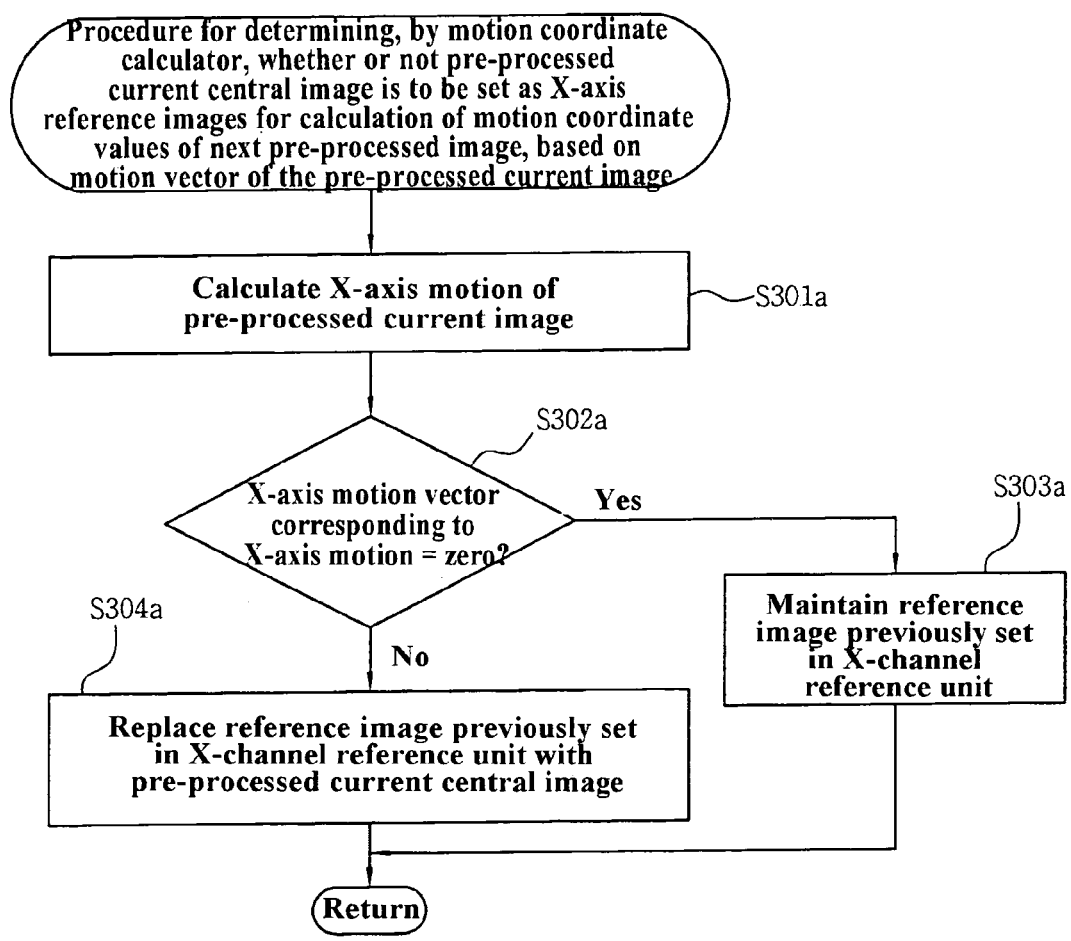
FIGS. 10a and 10b are flow charts illustrating the procedure for setting, by a motion coordinate calculator, the pre-processed current central image as X/Y-axis reference images, based on a motion vector of the pre-processed current image in accordance with the present invention.
Figure 10B:
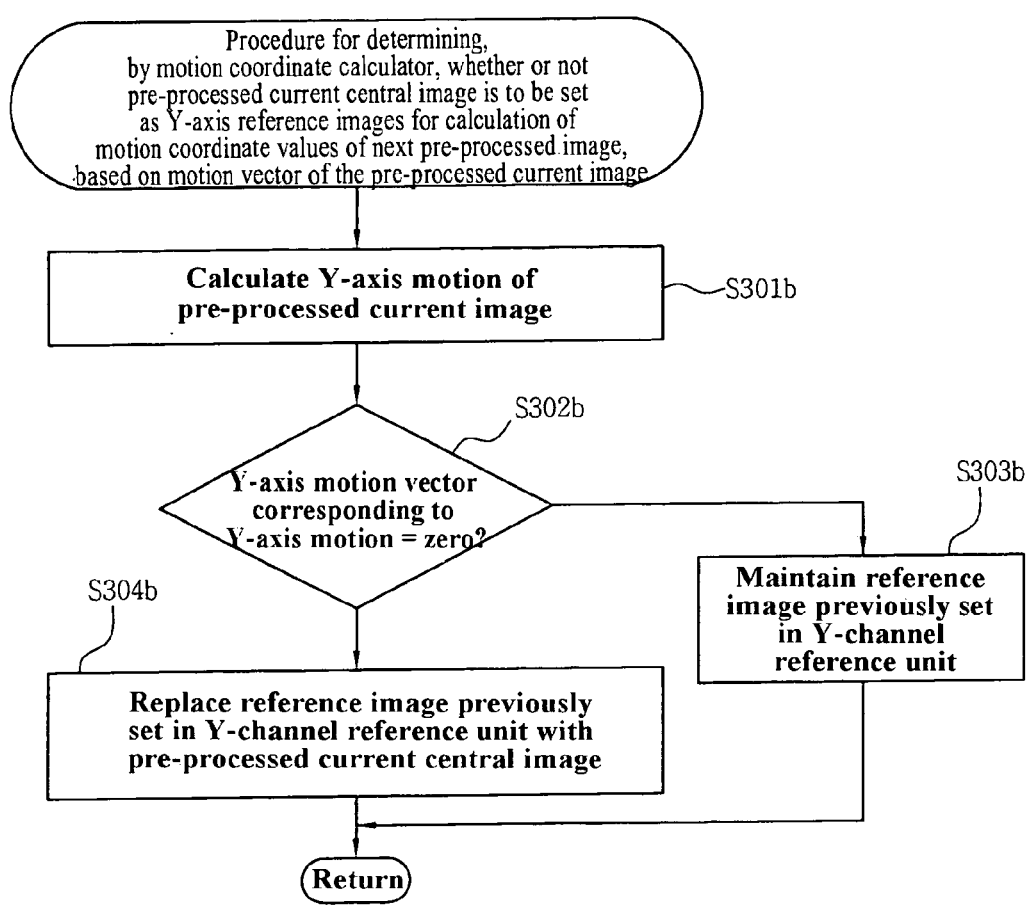

As shown in FIG. 10a, the motion coordinate calculator 140 calculates the X-axis motion of the pre-processed current image (S301a), and then determines whether or not the X-axis motion vector $V_X$ associated with the calculated X-axis motion has a value of zero (S302a).

When it is determined at step S302a that the X-axis motion vector $V_X$ has a value of zero, the motion coordinate calculator 140 does not change the reference image previously set in the X-channel reference unit 141 (S303a).

On the other hand, when it is determined at step S302a that the X-axis motion vector $V_X$ has a value other than zero, the motion coordinate calculator 140 replaces the reference image previously set in the X-channel reference unit 141 with the pre-processed current central image, and stores the pre-processed current central image (S304a).

Now, the procedure for setting the pre-processed current central image as a Y-axis reference image for a next pre-processed image or maintaining the previously-set Y-axis reference image, in accordance with the Y-axis motion vector value of the pre-processed current image, will be described with reference to FIG. 10b. As shown in FIG. 10b, the motion coordinate calculator 140 calculates the Y-axis motion of the pre-processed current image (S301b), and then determines whether or not the Y-axis motion vector $V_Y$ associated with the calculated Y-axis motion has a value of zero (S302b).

When it is determined at step S302b that the Y-axis motion vector $V_Y$ has a value of zero, the motion coordinate calculator 140 does not change the reference image previously set in the Y-channel reference unit 142 (S303b).

On the other hand, when it is determined at step S302b that the Y-axis motion vector $V_Y$ has a value other than zero, the motion coordinate calculator 140 replaces the reference image previously set in the Y-channel reference unit 142 with the pre-processed current central image, and stores the pre-processed current central image (S304b).

Subsequently, the motion coordinate calculator 140 compares the pre-processed current image with the X/Y-axis reference image while overlapping, a predetermined number of times, the X/Y-axis reference image with the pre-processed current image in different overlap states, respectively, thereby calculating the X/Y-axis motion coordinate values of the pre-processed current image, as shown in FIG. 7 (S400).

Figure 11A:
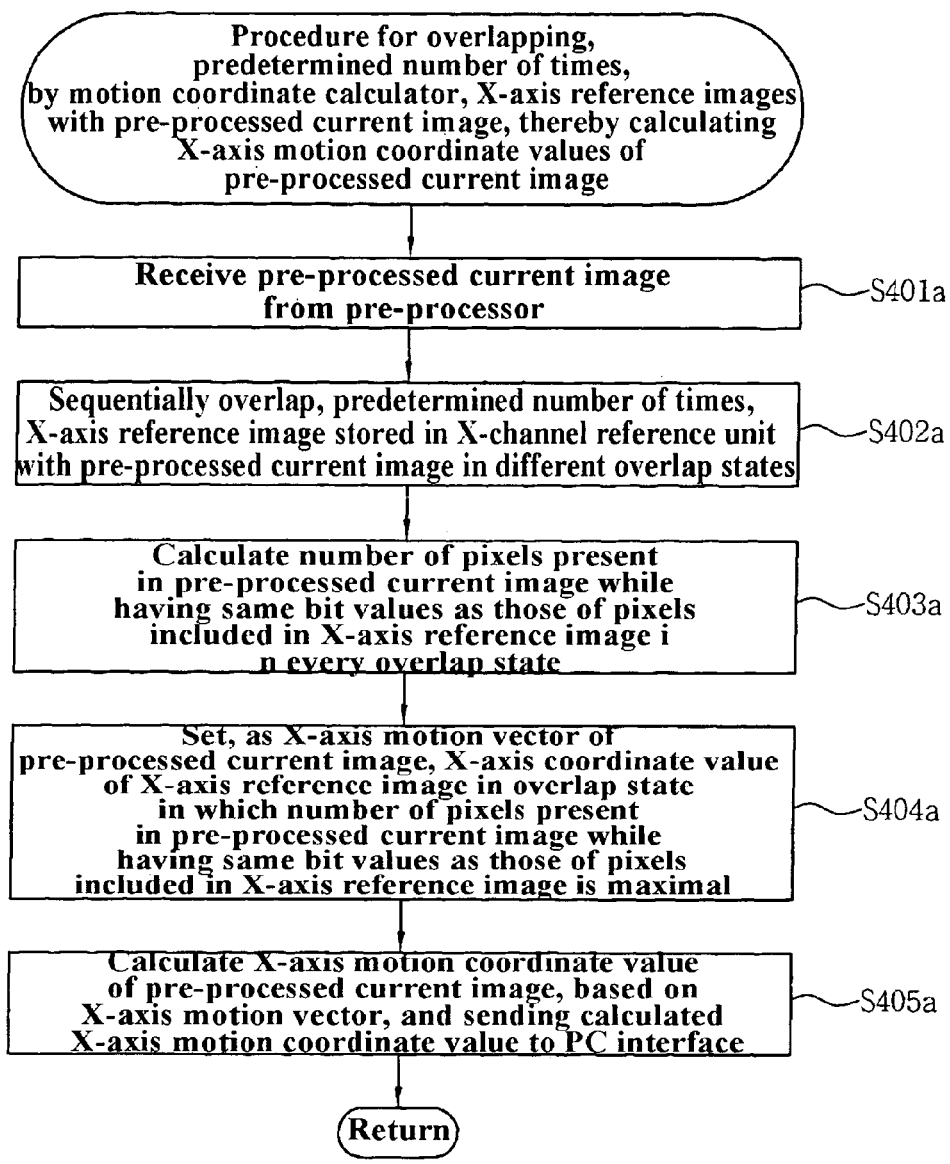
FIGS. 11a and 11b are flow charts illustrating the procedure for calculating X/Y-axis motion coordinate values of the pre-processed current image by the motion coordinate calculator in accordance with the present invention.
Figure 11B:
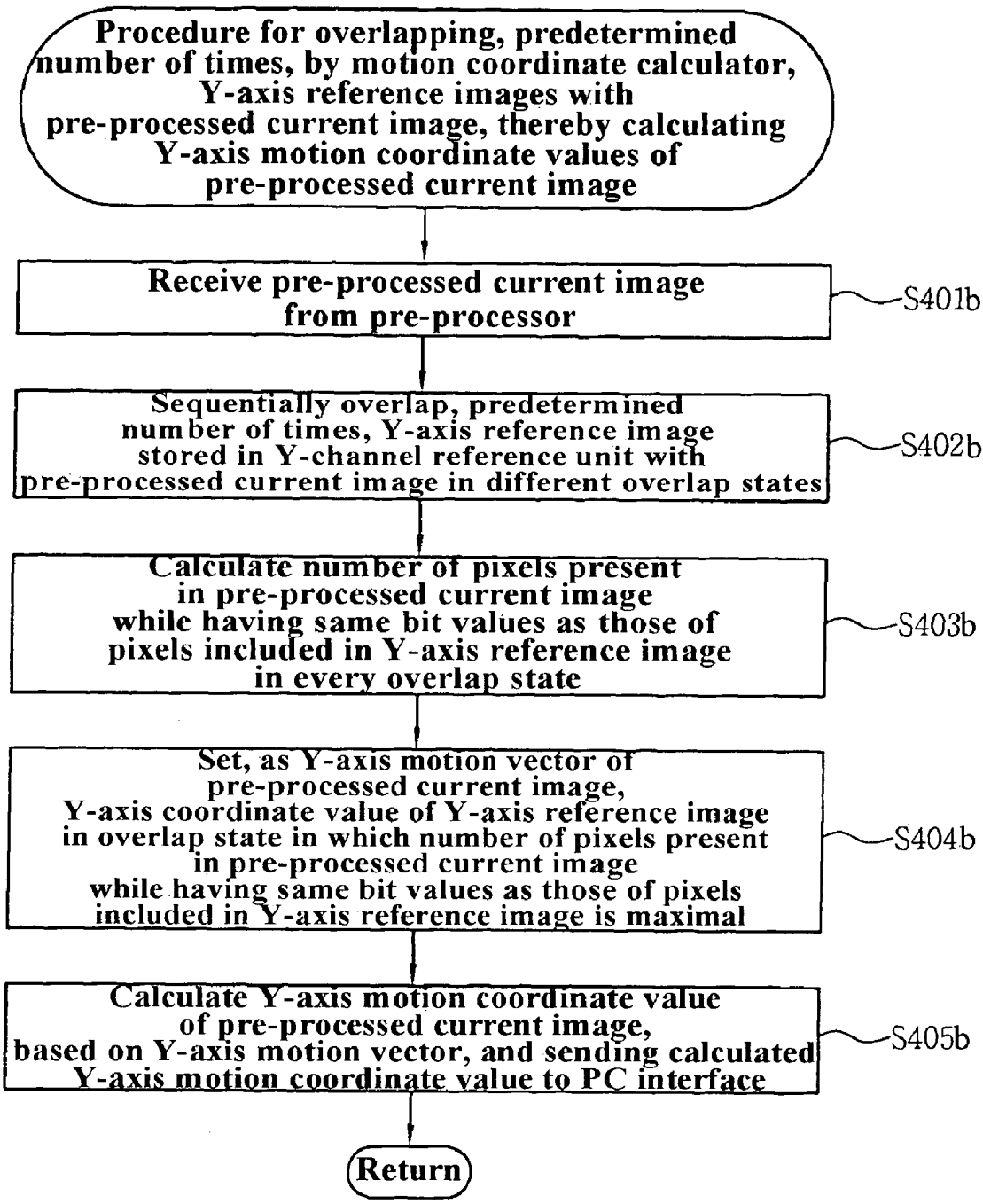

This procedure will be described in detail with reference to FIGS. 11a and 11b.

First, the procedure for calculating the X-axis motion coordinate value of the pre-processed current image in the motion coordinate calculator 140 will be described in detail with reference to FIG. 11a. When the motion coordinate calculator 140 receives the pre-processed current image from the pre-processor 130 (S401a), it overlaps, a predetermined number of times, the reference image set in the X-channel reference unit 141 with the received pre-processed current image in different overlap states, respectively (S402a).

In every overlap state, the motion coordinate calculator 140 compares the pre-processed current image with the X-axis reference image, thereby calculating the number of pixels present in the pre-processed current image while having the same bit values as those of the pixels included in the X-axis reference image (S403a).

Based on the calculated results at step S403a, the motion coordinate calculator 140 then sets, as an X-axis motion vector $V_X$, the X-axis coordinate value of the X-axis reference image in the case in which the number of pixels present in the pre-processed current image while having the same bit values as those of the pixels included in the X-axis reference image is maximal (S404a).

Thereafter, the motion coordinate calculator 140 calculates the X-axis motion coordinate value of the pre-processed current image, based on the set X-axis motion vector $V_X$, and sends the calculated X-axis motion coordinate value to the PC via the PC interface 200 (S405a).

Now, the procedure for calculating the Y-axis motion coordinate value of the pre-processed current image in the motion coordinate calculator 140 will be described in detail with reference to FIG. 11b. When the motion coordinate calculator 140 receives the pre-processed current image from the pre-processor 130 (S401b), it overlaps, a predetermined number of times, the reference image set in the Y-channel reference unit 141 with the received pre-processed current image in different overlap states, respectively (S402b).

In every overlap state, the motion coordinate calculator 140 compares the pre-processed current image with the Y-axis reference image, thereby calculating the number of pixels present in the pre-processed current image while having the same bit values as those of the pixels included in the Y-axis reference image (S403b).

Based on the calculated results at step S403b, the motion coordinate calculator 140 then sets, as an Y-axis motion vector $V_Y$, the Y-axis coordinate value of the Y-axis reference image in the case in which the number of pixels present in the pre-processed current image while having the same bit values as those of the pixels included in the Y-axis reference image is maximal (S404b).

Thereafter, the motion coordinate calculator 140 calculates the Y-axis motion coordinate value of the pre-processed current image, based on the set Y-axis motion vector $V_Y$, and sends the calculated Y-axis motion coordinate value to the PC via the PC interface 200 (S405b).

The PC interface 200 accumulates X/Y-axis motion coordinate values for a predetermined time, and then sends the accumulated X/Y-axis motion coordinate values to the PC. The PC interface 200 may be included in the device of the present invention. Alternatively, the PC interface 200 may be arranged outside the device of the present invention.

As apparent from the above description, in accordance with the optical navigation sensor device and the image processing method using the 2-dimensional sequential image process according to the present invention, analog voltage values for respective pixels received from the image pixel array of the sensor device are converted into 2-bit digital voltage values through a pre-process, respectively, so that it is possible to prevent a variation in the digital voltage values caused by a variation in light amount and noise generated from an analog circuit used in the sensor device, thereby accurately tracing the motion of the sensor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An optical navigation sensor device comprising:
   an image pixel array for calculating analog voltage values of pixels thereof respectively corresponding to relative intensities of reflected light beams incident to the pixels from a support surface, on which the sensor device is laid;
   an analog/digital (A/D) converter for converting the analog voltage values of the pixels received thereto into corresponding digital voltage values, respectively, thereby producing a current image of the support surface;
   a pre-processor for sequentially receiving the digital voltage values from the A/D converter for all pixels of the current support surface image in accordance with a predetermined timing signal, performing a pre-process for the current support surface image, thereby producing a pre-processed current image consisting of pixels each having a 2-bit digital voltage value, and extracting, from the pre-processed current image, a pre-processed current central image having a predetermined pixel array; and
   a motion coordinate calculator for setting, as X/Y-axis reference image candidates, the pre-processed current central image received from the pre-processor, calculating an X-axis motion vector while overlapping a previously-set X-axis reference image with the pre-processed current image, thereby calculating an X-axis motion coordinate value of the pre-processed current image, and calculating a Y-axis motion vector while overlapping a previously-set Y-axis reference image with the pre-processed current image, thereby calculating a Y-axis motion coordinate value of the pre-processed current image.

2. The optical navigation sensor device according to claim 1, wherein the pre-processor converts the digital voltage values of respective pixels of the current image sequentially received from the A/D converter into corresponding 2-bit values, respectively, by comparing a sum of the digital voltage value of a current one of the current image pixels, currently received, and the digital voltages values of the pixels vertically adjacent to the current pixel with a sum of the digital voltage value of the pixel horizontally spaced apart from the current pixel by a predetermined distance and the digital voltage values of the pixels vertically adjacent to the horizontally spaced pixel, thereby determining, based on the result of the comparison, one bit of the 2-bit value of the current pixel, and comparing a sum of the digital voltage value of the current pixel and the digital voltages values of the pixels horizontally adjacent to the current pixel with a sum of the digital voltage value of the pixel vertically spaced apart from the current pixel by a predetermined distance, and the digital voltage value of the pixels horizontally adjacent to the vertically spaced pixel, thereby determining, based on the result of the comparison, the other bit of the 2-bit value of the current pixel.

3. The optical navigation sensor device according to claim 2, wherein the pre-processor applies a weight to the pixels horizontally or vertically adjacent to the current pixel upon summing the digital voltage value of the current pixel and the digital voltage values of the adjacent pixels.

4. The optical navigation sensor device according to claim 1, wherein the motion coordinate calculator comprises:
   an X-channel reference unit for storing the pre-processed current central image received from the pre-processor as an X-axis reference image candidate for calculation of motion coordinate values of a next pre-processed image to be subsequently inputted, and setting the X-axis reference image candidate as an X-axis reference image for the next pre-processed image when an X-axis motion vector of the pre-processed current image corresponding to an X-axis motion has a value other than zero, while maintaining the previously-set X-axis reference image when the X-axis motion vector of the pre-processed current image has a value of zero;
   a Y-channel reference unit for storing the pre-processed current central image received from the pre-processor as a Y-axis reference image candidate for the calculation of the motion coordinate values of the next pre-processed image, and setting the Y-axis reference image candidate as a Y-axis reference image for the next pre-processed image when a Y-axis motion vector of the pre-processed current image corresponding to a Y-axis motion has a value other than zero, while maintaining the previously-set Y-axis reference image when the Y-axis motion vector of the pre-processed current image has a value of zero;
   an image comparing unit for receiving the pre-processed current image from the pre-processor, sequentially overlapping, a predetermined number of times, the X-axis reference image stored in the X-channel reference unit with the pre-processed current image in different overlap states, comparing the overlapped images with each other in every overlap state, thereby calculating the number of pixels present in the pre-processed current image while having the same bit values as those of the pixels included in the X-axis reference image in every overlap state, sequentially overlapping, a predetermined number of times, the Y-axis reference image stored in the Y-channel reference unit with the pre-processed current image in different overlap states, and comparing the overlapped images with each other in every overlap state, thereby calculating the number of pixels present in the pre-processed current image while having the same bit values as those of the pixels included in the Y-axis reference image in every overlap state; and a motion vector unit for setting, as the X-axis motion vector of the pre-processed current image, an X-axis coordinate value of the X-axis reference image in the overlap state in which the number of pixels present in the pre-processed current image while having the same bit values as those of the pixels included in the X-axis reference image is maximal, thereby calculating the X-axis motion coordinate value of the pre-processed current image, and setting, as the Y-axis motion vector of the pre-processed current image, a Y-axis coordinate value of the Y-axis reference image in the overlap state in which the number of pixels present in the pre-processed current image while having the same bit values as those of the pixels included in the Y-axis reference image is maximal, thereby calculating the Y-axis motion coordinate value of the pre-processed current image.

5. An image processing method using a 2-dimensional sequential image process, comprising the steps of:

(A) storing, by a pre-processor, digital voltage values of respective pixels of an image received from a pre-processor via an analog/digital (A/D) converter in a memory;

(B) performing, by the pre-processor, a pre-process for the digital voltage values of respective pixels sequentially received from the memory in accordance with a pre-determined timing signal, thereby producing a pre-processed current image, and extracting a pre-processed current central image from the pre-processed current image;

(C) determining, by a motion coordinate calculator, whether or not the pre-processed current central image is to be set as X/Y-axis reference images for calculation of motion coordinate values of a next pre-processed image, based on a motion vector of the pre-processed current image; and (D) comparing, by the motion coordinate calculator, the pre-processed current image received from the pre-processor with X/Y-axis reference images respectively stored in X/Y-channel reference units, thereby calculating X/Y-axis motion coordinate values of the pre-processed current image.

6. The image processing method according to claim 5, wherein the step (A) comprises the steps of:

(A-1) converting, by an image pixel array, reflected light beams inputted to respective pixels of the image pixel array from a support surface, on which an optical mouse is laid, into analog voltage values, respectively;

(A-2) sending, by the image pixel array, the analog voltage values of the pixels to the A/D converter;

(A-3) converting, by the A/D converter, the analog voltage values of the pixels received from the image pixel array into corresponding digital voltage values, respectively;

(A-4) sensing the digital voltage values of the pixels from the A/D converter to the pre-processor; and (A-5) storing, by the pre-processor, the digital voltage values of the pixels received from the A/D converter in the memory.

7. The image processing method according to claim 5, wherein the step (B) comprises the steps of:

(B-1) sequentially receiving, by the pre-processor, the digital voltage values of the pixels from the memory in accordance with the predetermined timing signal;

(B-2) setting, by the pre-processor, a basic image matrix consisting of a current one of the pixels to be currently converted into a predetermined bit value, and pixels adjacent to the current pixel;

(B-3) performing, by the pre-processor, a column-to-column/row-to-row calculation for the digital voltage values of the pixels included in the basic image matrix, thereby converting the digital voltage value of the current pixel into a 2-bit digital voltage value;

(B-4) producing, by the pre-processor, a pre-processed current image having a pixel array consisting of pixels respectively having 2-bit digital voltage values each obtained at the step (B-3); and (B-5) extracting, by the pre-processor, a pre-processed current central image having a predetermined pixel array from the pre-processed current image.

8. The image processing method according to claim 7, wherein the step (B-3) comprises the steps of:

(B-3-1) comparing a sum of the digital voltage value of a current one of the current image pixels, currently received, and the digital voltages values of the pixels vertically adjacent to the current pixel with a sum of the digital voltage value of the pixel horizontally spaced apart from the current pixel by a predetermined distance and the digital voltage values of the pixels vertically adjacent to the horizontally spaced pixel, thereby determining, based on the result of the comparison, one bit of the 2-bit value of the current pixel; and (B-3-2) comparing a sum of the digital voltage value of the current pixel and the digital voltages values of the pixels horizontally adjacent to the current pixel with a sum of the digital voltage value of the pixel vertically spaced apart from the current pixel by a predetermined distance, and the digital voltage value of the pixels horizontally adjacent to the vertically spaced pixel, thereby determining, based on the result of the comparison, the other bit of the 2-bit value of the current pixel.

9. The image processing method according to claim 8, wherein a weight is applied to the pixels horizontally or vertically adjacent to the current pixel upon summing the digital voltage value of the current pixel and the digital voltage values of the adjacent pixels.

10. The image processing method according to claim 7, wherein the basic image matrix is a 3×3 matrix.

11. The image processing method according to claim 5, wherein the step (C) comprises the steps of:

(C-1) calculating, by the motion coordinate calculator, an X-axis motion of the pre-processed current image;

(C-2) determining, by the motion coordinate calculator, whether or not an X-axis motion vector corresponding to the calculated X-axis motion has a value of zero;

(C-3) maintaining, by the motion coordinate calculator, the reference image previously set in an X-channel reference unit when it is determined at the step (C-2) that the X-axis motion vector has a value of zero;

(C-4) replacing, by the motion coordinate calculator, the reference image previously set in the X-channel reference unit with the pre-processed current central image when it is determined at the step (C-2) that the X-axis motion vector has a value other than zero;

(C-5) calculating, by the motion coordinate calculator, a Y-axis motion of the pre-processed current image;

(C-6) determining, by the motion coordinate calculator, whether or not a Y-axis motion vector corresponding to the calculated Y-axis motion has a value of zero;

(C-7) maintaining, by the motion coordinate calculator, the reference image previously set in a Y-channel reference unit when it is determined at the step (C-6) that the Y-axis motion vector has a value of zero; and (C-8) replacing, by the motion coordinate calculator, the reference image previously set in the Y-channel reference unit with the pre-processed current central image when it is determined at the step (C-6) that the Y-axis motion vector has a value other than zero.

12. The image processing method according to claim 5, wherein the step (D) comprises the steps of:

(D-1) receiving, by the motion coordinate calculator, the pre-processed current image from the pre-processor;

(D-2) sequentially overlapping, a predetermined number of times, by the motion coordinate calculator, the X-axis reference image stored in the X-channel reference unit with the pre-processed current image in different overlap states;

(D-3) comparing, by the motion coordinate calculator, the overlapped images with each other in every overlap state, thereby calculating the number of pixels present in the pre-processed current image while having the same bit values as those of the pixels included in the X-axis reference image in every overlap state;

(D-4) setting, by the motion coordinate calculator, as the X-axis motion vector of the pre-processed current image, an X-axis coordinate value of the X-axis reference image in the overlap state in which the number of pixels present in the pre-processed current image while having the same bit values as those of the pixels included in the X-axis reference image is maximal;

(D-5) calculating, by the motion coordinate calculator, the X-axis motion coordinate value of the pre-processed current image, based on the set X-axis motion vector;

(D-6) sequentially overlapping, a predetermined number of times, by the motion coordinate calculator, the Y-axis reference image stored in the Y-channel reference unit with the pre-processed current image in different overlap states;

(D-7) comparing, by the motion coordinate calculator, the overlapped images with each other in every overlap state, thereby calculating the number of pixels present in the pre-processed current image while having the same bit values as those of the pixels included in the Y-axis reference image in every overlap state;

(D-8) setting, by the motion coordinate calculator, as the Y-axis motion vector of the pre-processed current image, a Y-axis coordinate value of the Y-axis reference image in the overlap state in which the number of pixels present in the pre-processed current image while having the same bit values as those of the pixels included in the Y-axis reference image is maximal; and (D-9) calculating, by the motion coordinate calculator, the Y-axis motion coordinate value of the pre-processed current image, based on the set Y-axis motion vector.

* * * * *